(12) United States Patent
Rupp

(10) Patent No.: US 11,394,200 B2
(45) Date of Patent: Jul. 19, 2022

(54) DEVICE AND METHOD FOR COUPLING TWO DC GRIDS

(71) Applicant: Siemens Aktiengesellschaft, Munich (DE)

(72) Inventor: Jürgen Rupp, Munich (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 17/276,741

(22) PCT Filed: Sep. 16, 2019

(86) PCT No.: PCT/EP2019/074642
§ 371 (c)(1),
(2) Date: Mar. 16, 2021

(87) PCT Pub. No.: WO2020/058162
PCT Pub. Date: Mar. 26, 2020

(65) Prior Publication Data
US 2022/0045507 A1 Feb. 10, 2022

(30) Foreign Application Priority Data
Sep. 19, 2018 (DE) ............ 10 2018 215 881.9

(51) Int. Cl.
*H03K 17/60* (2006.01)
*H02H 9/02* (2006.01)
(Continued)

(52) U.S. Cl.
CPC ............. *H02H 9/02* (2013.01); *H03K 17/56* (2013.01); *H02J 1/00* (2013.01)

(58) Field of Classification Search
CPC ........... H03K 17/567; H03K 17/04123; H03K 17/6877; H03K 17/063; H03K 17/6874
(Continued)

(56) References Cited

U.S. PATENT DOCUMENTS

| 9,537,400 B2* | 1/2017 | Noebauer | ............... H02M 1/38 |
| 2001/0015906 A1* | 8/2001 | Schneider | ............... G11C 11/22 |
| | | | 365/145 |

(Continued)

FOREIGN PATENT DOCUMENTS

| AU | 2018 227938 | 9/2018 | ............. H03K 17/16 |
| CN | 110994961 A | * 4/2020 | |

(Continued)

OTHER PUBLICATIONS

Search Report and Written Opinion for International Application No. PCT/EP2019/074642, 12 pages, dated Dec. 6, 2019.
(Continued)

*Primary Examiner* — Quan Tra
(74) *Attorney, Agent, or Firm* — Slayden Grubert Beard PLLC

(57) ABSTRACT

Various embodiments include a device for coupling two DC grids comprising source-side and load-side capacitances comprising: a switching device for current regulation, the switching device including two series-connected switching modules; wherein each of the switching modules includes at least one controllable semiconductor switching element connected in parallel to a respective series circuit comprising a resistor and a capacitor; and a control unit. The control unit is programmed to: switch the controllable semiconductor switching element of one of the two switching modules on and at the same time switch the controllable semiconductor switching element of the other of the two switching modules (Continued)

off; switch the controllable semiconductor switching element of the other of the two switching modules on and at the same time switch the controllable semiconductor switching element of the one of the two switching modules off; repeat steps a) and b) until the voltages of the source-side and load-side capacitances have aligned with one another; and switch the controllable semiconductor switching elements of the two switching modules on.

15 Claims, 2 Drawing Sheets

(51) Int. Cl.
 *H03K 17/56* (2006.01)
 *H02J 1/00* (2006.01)
(58) Field of Classification Search
 USPC .................................................. 327/432, 530
 See application file for complete search history.

(56) References Cited

U.S. PATENT DOCUMENTS

| | | | |
|---|---|---|---|
| 2012/0306264 A1 | 12/2012 | Komma et al. | 307/9.1 |
| 2015/0239363 A1 | 8/2015 | Brockerhoff | B60L 11/1848 |
| 2017/0063077 A1 | 3/2017 | Donath | H02H 9/00 |
| 2018/0226786 A1 | 8/2018 | Fischer | H02H 3/20 |

FOREIGN PATENT DOCUMENTS

| | | | | |
|---|---|---|---|---|
| DE | 10 2015 102481 | | 8/2015 | H02J 7/00 |
| DE | 10 2017 202103 | | 3/2018 | H02H 9/02 |
| EP | 2523334 | A1 | 11/2012 | H02J 7/34 |
| EP | 3 367 567 | | 8/2018 | H03K 17/0814 |
| WO | 2011/098374 | A1 | 8/2011 | H01H 9/54 |

OTHER PUBLICATIONS

German Search Report, Application No. 102018215881.9, 4 pages, dated Jun. 11, 2019.

\* cited by examiner

DEVICE AND METHOD FOR COUPLING TWO DC GRIDS

CROSS-REFERENCE TO RELATED APPLICATIONS

This application is a U.S. National Stage Application of International Application No. PCT/EP2019/074642 filed Sep. 16, 2019, which designates the United States of America, and claims priority to DE Application No. 10 2018 215 881.9 filed Sep. 19, 2018, the contents of which are hereby incorporated by reference in their entirety.

TECHNICAL FIELD

The present disclosure relates to DC grids. Various embodiments of the teachings herein may include devices and/or methods for coupling two DC grids comprising source-side and load-side capacitances by means of a switching device for current regulation.

BACKGROUND

DC grids often comprise large capacitances, such as, for example, DC-link capacitors of converters. If two DC grids comprising source-side and load-side capacitances are connected to one another, wherein one of the capacitances is already at the operating voltage, while the capacitance in the other DC grid is still discharged, very high compensation currents occur when the two DC grids are connected directly. In order to limit the level of these currents, the connection of two DC grids comprising source-side and load-side capacitances takes place via suitable switching devices, as is shown in the electrical equivalent circuit diagrams in FIGS. 1 and 2.

FIG. 1 shows the electrical equivalent circuit diagram of a switching device 1, which is connected to a DC voltage source 2 via a source-side inductance 3. A source-side capacitance 7 is provided in parallel with the series circuit comprising the DC voltage source 2 and the source-side inductance 3. On the output side, the switching device 1 is connected to a load-side capacitance 8 via a load-side inductance 5. The source-side and load-side inductances 3, 5 do not necessarily need to represent physical components of the two DC voltage grids connected via the switching device 1. The source-side and load-side inductances 3, 5 may also be line inductances. The source-side and load-side capacitances 7, 8 are, for example, DC-link capacitors of converters (not illustrated).

In the switching device 1 shown in FIG. 1, the connection between the two DC voltage grids is first produced via a charging resistor 20. The charging resistor 20 is connected in series with a switching element 21 and serves the purpose of limiting the current I and avoiding damage to the components. Only when the voltage between the two bars of the DC grids has got close enough for a low-resistance connection to be possible is the charging resistor 20 bypassed by a main switch 22. The switch 21 is also referred to as a precharging switch.

In the variant shown in FIG. 2, the switching device 1 comprises a single semiconductor switching element, with the result that a charging current I can be set by clocked switching-on and switching-off of the semiconductor switching element. By varying the frequency and the pulse width ratio, the quantity of charge per unit time and therefore the average charging current can be set. Therefore, however, high current peaks result depending on the impedance of the connection. In addition, this variant has a disadvantage if only a low inductance or a resistor is provided between the source-side and load-side capacitance 7, 8.

SUMMARY

The teachings of the present disclosure include devices and methods for coupling two DC grids having source-side and load-side capacitances by means of a switching device for current regulation which are improved in terms of design and/or functionally. For example, some embodiments include a device for coupling two DC grids comprising source-side and load-side capacitances (7, 8) by means of a switching device (1) for current regulation, characterized in that the switching device (1) comprises two series-connected switching modules (10-1, 10-2), wherein each of the switching modules (10-1, 10-2) comprises at least one controllable semiconductor switching element (13-1, 13-2), with which a series circuit comprising a resistor (14-1, 14-2) and a capacitor (15-1, 15-2) is connected in parallel, wherein a control unit of the switching device (1) is designed to a) switch the controllable semiconductor switching element (13-1) of one of the two switching modules (10-1, 10-2) on and at the same time switch the controllable semiconductor switching element (13-2) of the other of the two switching modules (10-1, 10-2) off; b) switch the controllable semiconductor switching element (13-2) of the other of the two switching modules (10-1, 10-2) on and at the same time switch the controllable semiconductor switching element (13-1) of the one of the two switching modules (10-1, 10-2) off; c) repeat steps a) and b) until the voltages of the source-side and load-side capacitances (7, 8) have aligned with one another; and d) switch the controllable semiconductor switching elements (13-1, 13-2) of the two switching modules (10-1, 10-2) on.

In some embodiments, the control unit is designed to perform steps a) and b) temporally one after the other.

In some embodiments, the control unit is designed to set, by virtue of the durations of the performance of steps a) and/or b), the average current from the one DC grid into the other DC grid.

In some embodiments, the control unit is designed to set, by virtue of a pulse width ratio of the controllable semiconductor switching modules switched on in steps a) and/or b), the current from the one DC grid into the other DC grid.

In some embodiments, one of the two DC grids comprises a capacitive load which is switchable by means of a controllable switch, wherein the control unit is designed to operate the switching device (1) for current regulation in the chopper mode when the control unit receives a signal from the controllable switch which signals a short circuit.

In some embodiments, the control unit is designed to evaluate the current characteristic which flows from the other of the two DC grids to the one of the two DC grids with the switchable capacitive load.

In some embodiments, the control unit ( ) is designed to evaluate the voltage characteristic during the chopper mode of the switching device (1).

As another example, some embodiments include a method for coupling two DC grids comprising source-side and load-side capacitances (7, 8) by means of a switching device (1) for current regulation, wherein the switching device (1) comprises two series-connected switching modules (10-1, 10-2), wherein each of the switching modules (10-1, 10-2) comprises at least one controllable semiconductor switching element (13-1, 13-2), with which a series circuit comprising a resistor (14-1, 14-2) and a capacitor (15-1, 15-2) is connected in parallel, wherein, by means of a control unit of the switching device (1): a) the controllable semiconductor switching element (13-1) of one of the two switching modules (10-1, 10-2) is switched on and at the same time the controllable semiconductor switching element (13-2) of the other of the two switching modules (10-1, 10-2) is switched off; b) the controllable semiconductor switching element (13-2) of the other of the two switching modules (10-1, 10-2) is switched on and at the same time the controllable semiconductor switching element (13-1) of the one of the two switching modules (10-1, 10-2) is switched off; c) steps a) and b) are repeated until the voltages of the source-side and load-side capacitances ( ) have aligned with one another; and d) the controllable semiconductor switching elements (13-1, 13-2) of the two switching modules (10-1, 10-2) are switched on.

In some embodiments, the control unit performs steps a) and b) temporally one after the other.

In some embodiments, the control unit matches the durations of the performance of steps a) and/or b) in order to set the average current from the one DC grid into the other DC grid to a specific value.

In some embodiments, the control unit matches a pulse width ratio of the controllable semiconductor switching modules which are switched on in steps a) and/or b) in order to set the current from the one DC grid into the other DC grid.

In some embodiments, one of the two DC grids comprises a capacitive load which is switchable by means of a controllable switch, wherein the switching device (1) for current regulation is operated in the chopper mode when the control unit receives a signal from the controllable switch which signals a short circuit.

In some embodiments, the control unit evaluates the current characteristic which flows from the other of the two DC grids to the one of the two DC grids with the switchable capacitive load.

In some embodiments, the control unit evaluates the voltage characteristic during the chopper mode of the switching device (1).

As another example, some embodiments include a computer program product which can be loaded onto the internal memory of an arithmetic logic unit and comprises code segments, with which one or more of the methods as described herein are performed when the program is running on the arithmetic logic unit.

BRIEF DESCRIPTION OF THE DRAWINGS

The teachings herein are explained in more detail below using exemplary embodiments in the drawings, in which.

Identical elements have been provided with the same reference symbols in the following description.

DETAILED DESCRIPTION

Figure 1:
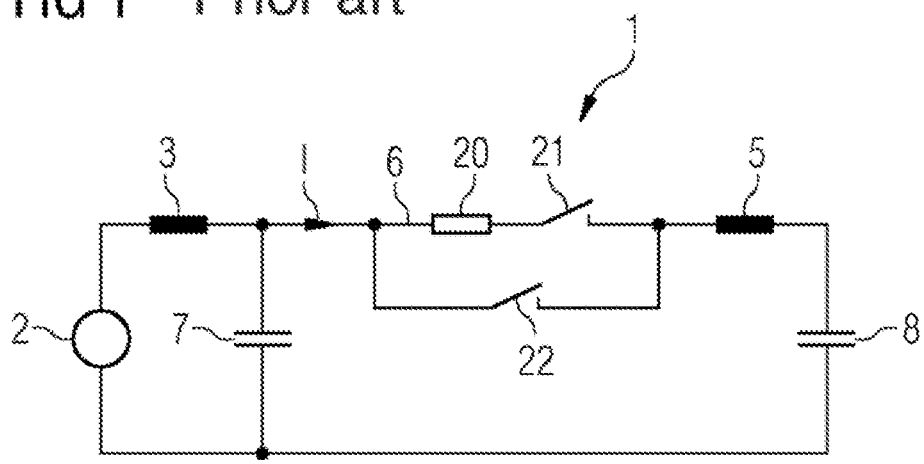
FIG. 1 shows an electrical equivalent circuit diagram of a first known switching device in a DC voltage grid comprising source-side and load-side capacitances.
Figure 2:
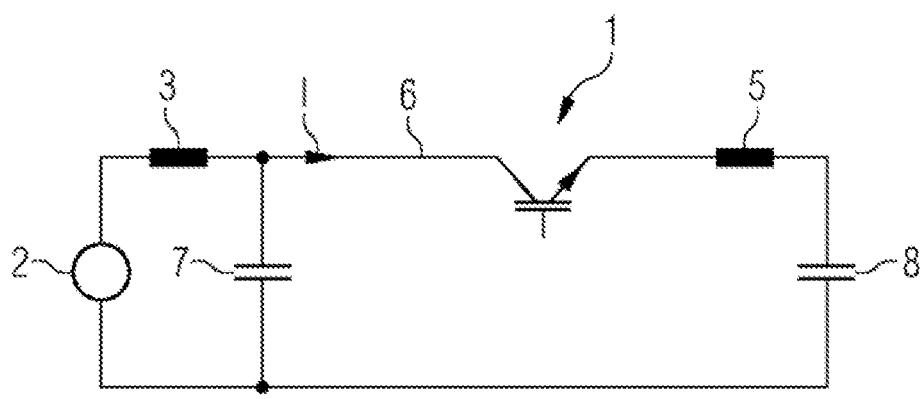
FIG. 2 shows an electrical equivalent circuit diagram of a second known switching device in a DC voltage grid comprising source-side and load-side capacitances.

Some embodiments of the teachings herein include a device for coupling two DC grids comprising source-side and load-side capacitances by means of a switching device for current regulation. In some embodiments, the switching device comprises two series-connected switching modules, wherein each of the switching modules comprises at least one controllable semiconductor switching element, with which a series circuit comprising a resistor and a capacitor is connected in parallel.

PCT/EP2018/054775 by the Applicant describes a switching device which comprises at least two series-connected switching modules, which serves the purpose of being able to perform a "soft" shutdown operation in a current path comprising source-side and load-side inductances. The switching device makes it possible to reduce the current flow in the current path not abruptly but in ramped fashion. By virtue of at least one of the at least two switching modules, a back-EMF is built up in the current path. This is made possible by operation of the respective semiconductor switching element of the switching modules in the clocked range. Thereby, the high-power losses in the event of a shutdown are not converted in the semiconductor switching element of the respective switching modules, but predominantly in the resistor of the respective switching modules. The switching device can thus dispense with voltage-limiting components, such as varistors, which are expensive, heavy and intensive in terms of physical space. The semiconductor switching element in the respective switching modules in this case performs the role of a chopper. The switching device which is known in principle is used in accordance with the invention for coupling two DC grids comprising source-side and load-side capacitances. In this case, the chopper mode is used not when the two DC grids are isolated in order to reduce the current slowly, but during connection (switching-on) of the two DC grids in order to limit the charging current.

In some embodiments of the teachings herein, a control unit is provided which is designed to:

a) switch the controllable semiconductor switching element of one of the two switching modules on and at the same time switch the controllable semiconductor switching element of the other of the two switching modules off;

b) switch the controllable semiconductor switching element of the other of the two switching modules on and at the same time switch the controllable semiconductor switching element of the one of the two switching modules off;

c) repeat steps a) and b) until the voltages of the source-side and load-side capacitances have aligned with one another; and d) switch the controllable semiconductor switching elements of the two switching modules on.

This operation of the at least two series-connected switching modules makes it possible to perform a compensation process for the source-side and load-side capacitances before the two DC grids are permanently connected to one another via the switching elements of the switching modules. The occurrence of high compensation currents can thus be avoided.

In some embodiments, in order to limit the current further, the two semiconductor switching elements according to step b) may be switched off at the same time (step b1). In this configuration, then steps a), b), and b1) are repeated until the voltages of the source-side and load-side capacitances have aligned with one another. In some embodiments, the control unit is designed to perform steps a) and b) temporally one after the other. Steps a) and b) are therefore repeated alternately until the voltages of the source-side and load-side capacitances have aligned with one another.

In some embodiments, the control unit is further designed to set, by virtue of the duration of the performance of steps a) and/or b), the average current from the one of the two DC grids into the other of the two DC grids. In some embodiments, the control unit is designed to set, by virtue of a pulse width ratio of the controllable semiconductor switching modules switched on in steps a) and/or b), the maximum current from the one DC grid into the other DC grid. By virtue of each of the two variants, as a result the duration until the voltages of the source-side and load-side capacitances have aligned with one another can also be determined. The maximum occurring peak current is limited, apart from the effect of existing line impedances, by virtue of the fact that, during the switching operation, always at least one of the resistors of the semiconductor switching modules is in the circuit. Therefore, the maximum current is statically limited without inductances being required.

In some embodiments, at least one of the two DC grids comprises a capacitive load which is switchable by means of a controllable switch, wherein the control unit is designed to operate the switching device for current regulation in the chopper mode when the control unit receives a signal from the controllable switch which signals a short circuit. By virtue of the current caused by the compensation operation, a short circuit can be incorrectly detected in an integrated monitoring unit of the controllable switch and can result in the controllable switch shutting down. This shutdown which is performed for safety reasons can nevertheless be avoided if the controllable switch, which is provided in series with the switchable capacitive load, is not shut down immediately, but first current limitation is achieved in the chopper mode. As a result, there remains time for detecting whether a short circuit is actually present or an increased charging current or compensation current is only temporarily present between the two DC grids.

For this purpose, the control unit can be designed to evaluate the current characteristic which flows from the other of the two DC grids to the one of the two DC grids with the switchable capacitive load. In some embodiments, the control unit may be designed to evaluate the voltage characteristic during the chopper mode of the switching device. During connection of the capacitive load, the voltage will only dip briefly, whereas in the event of a short circuit, the detected voltage dips permanently.

Some embodiments include a method for coupling two DC grids comprising source-side and load-side capacitances by means of a switching device for current regulation. The switching device comprises two series-connected switching modules, wherein each of the switching modules comprises at least one controllable semiconductor switching element, with which a series circuit comprising a resistor and a capacitor is connected in parallel. By means of the control unit of the switching device:
a) the controllable semiconductor switching element of one of the two switching modules is switched on and at the same time the controllable semiconductor switching element of the other of the two switching modules is switched off;
b) the controllable semiconductor switching element of the other of the two switching modules is switched on and at the same time the controllable semiconductor switching element of the one of the two switching modules is switched off;
c) steps a) and b) are repeated until the voltages of the source-side and load-side capacitances have aligned with one another; and
d) the controllable semiconductor switching elements of the two switching modules are switched on.

In some embodiments, the control unit performs steps a) and b) temporally one after the other. If the control unit is designed to switch the two semiconductor switching elements according to step b) off at the same time (step b1), steps a), b), and b1) are repeated until the voltages of the source-side and load-side capacitances have aligned with one another.

In some embodiments, the control unit matches the durations of the performance of steps a) and/or b) in order to set the average current from the one DC grid into the other DC grid to a specific value.

In some embodiments, the control unit matches a pulse width ratio of the controllable semiconductor switching modules which are switched on in steps a) and/or b) in order to set the maximum current from the one DC grid into the other DC grid.

If one of the two DC grids comprises a capacitive load which is switchable by means of a controllable switch, the switching device for current regulation is operated in the chopper mode when the control unit receives a signal from the controllable switch which signals a short circuit. The control unit can then evaluate the current characteristic which flows from the other of the two DC grids to the one of the two DC grids with the switchable capacitive load. In some embodiments, the control unit evaluates the voltage characteristic during the chopper mode of the switching device.

Some embodiments include a computer program product which can be loaded onto the internal memory of an arithmetic logic unit and comprises code segments, with which the methods described herein may be performed when the program is running on the arithmetic logic unit. The computer program product can be embodied in the form of a storage medium, for example a DVD, a CD-ROM or a USB memory stick. Likewise, the computer program product may be present in the form of a signal which can be loaded over a wireless or wired cable.

Figure 3:
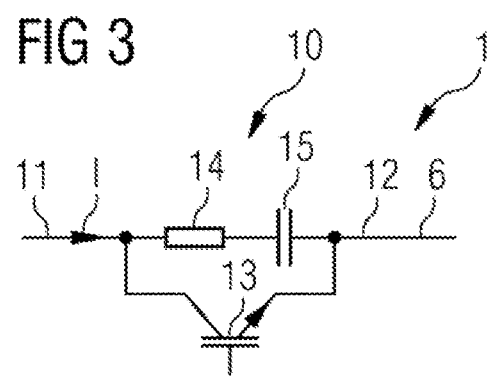
FIG. 3 shows an electrical equivalent circuit diagram which shows the design of a single unidirectional switching module for a known switching device.

FIG. 3 shows the schematic design of a switching module 10 of a switching device 1 from PCT/EP2018/054775 for coupling a current path 6 comprising source-side and load-side capacitances. The switching module 10 comprises a controllable semiconductor switching element 13. The controllable semiconductor switching element 13 may be a bipolar transistor, an IGBT, a MOSFET, an IGCT or a thyristor having a turn-off device. The load terminals of the controllable semiconductor switching element 13 are connected between a first switching module terminal 11 and a second switching module terminal 12. In addition, a series circuit comprising a resistor 14 and a capacitor 15 is arranged between the first and the second switching module terminal 11, 12. In other words, an RC element formed from the resistor 14 and the capacitor 15 is connected in parallel with the load terminals of the controllable switching element 13.

The principal way in which such an individual switching module of the switching device 1 operates is as follows: if the switching device 1 is intended to conduct current, the controllable semiconductor switching element 13 is in the on state. As soon as the current path 6 is intended to be interrupted with the aid of the switching device 1, the controllable semiconductor switching element 13 is switched off by a control unit (not shown in the figures). As a result, the current I flowing in the current path 6 can now only continue to flow via the RC element formed from the resistor 14 and the capacitor 15. The capacitor 15 is charged as a result of the current I flowing in said capacitor until a preset upper threshold value of the voltage drop across said capacitor has been reached. For this purpose, a corresponding measuring device (not illustrated) can be provided in the switching module 10. As soon as the preset upper threshold value has been reached, the controllable semiconductor switching element 13 is switched on again. As a result, the capacitor 15 can be discharged via the resistor 14 and the controllable semiconductor switching element 13. As soon as a preset lower threshold value of the voltage drop across the capacitor 15 has been reached, the controllable semiconductor switching element 13 is switched on again by means of its control device.

Figure 4:
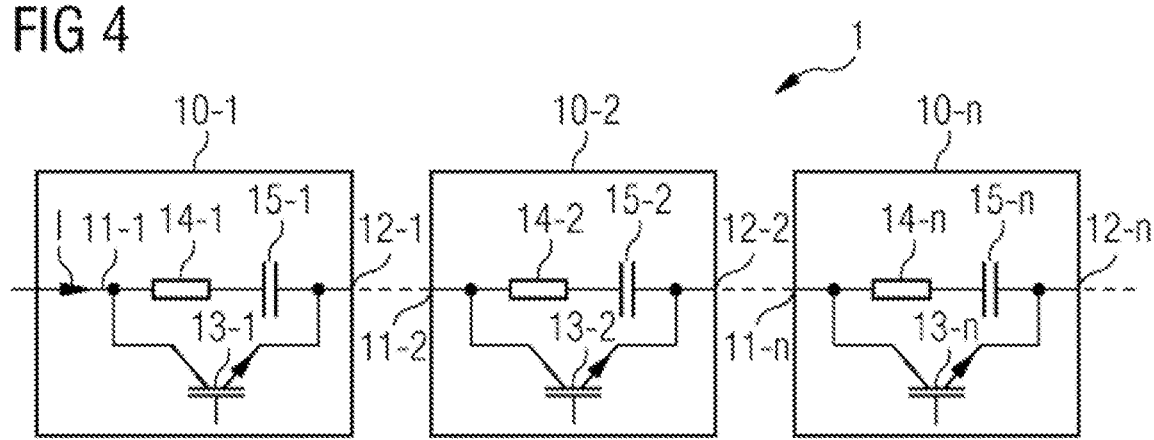
FIG. 4 shows an electrical equivalent circuit diagram of a series connection of three switching modules shown in FIG. 3.

If the switching device 1, which was originally designed for interrupting a current path having source-side and load-side inductances, were to only comprise a single switching module 1, as illustrated in FIG. 3, only voltages can be managed which are lower than the maximum voltage of the controllable semiconductor switching element 13 and the capacitor 15. In the case of higher voltages occurring, the controllable semiconductor switching element 13 and/or the capacitor could be destroyed. In order to interrupt a current path of a DC voltage grid with higher voltages, provision is therefore made, as shown in FIG. 4, for a plurality of switching modules as shown in FIG. 3 to be connected in series. Such a switching device 1 having at least two series-connected switching modules is used for coupling two DC grids comprising source-side and load-side capacitances.

Figure 5:
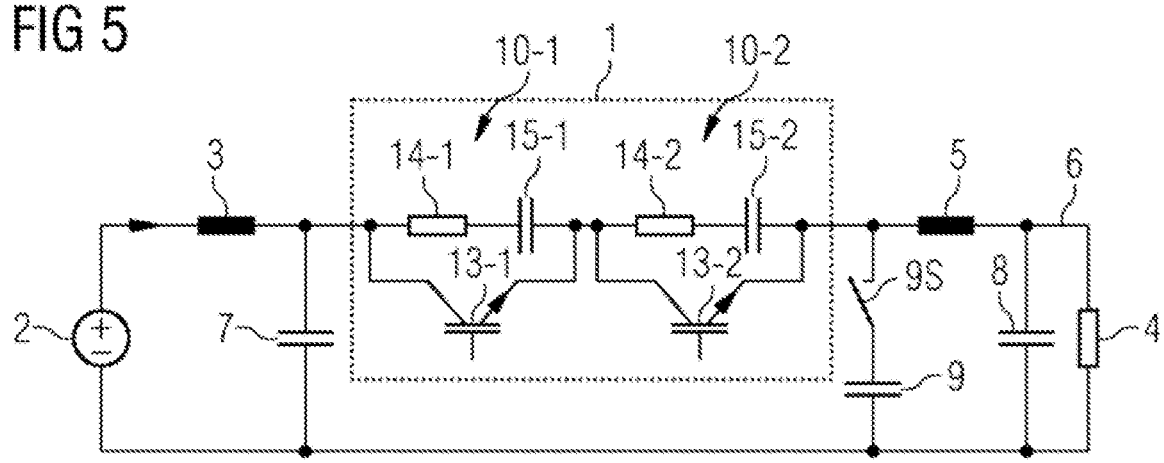
FIG. 5 shows an electrical equivalent circuit diagram of a switching device incorporating teachings of the present disclosure in a DC voltage grid comprising source-side and load-side capacitances.

FIG. 4 shows an electrical equivalent circuit diagram of a series circuit of n switching modules 10-1, 10-2, . . . , 10-n (in general: 10-i, where i=1 to n). Each of the switching modules 10-i is constructed in the manner described in FIG. 3. The series connection of the switching modules 10-i in this case takes place in such a way that the second switching module terminal 12-1 of the first switching module 10-1 is connected to the first switching module terminal 11-2 of the following switching module 10-2, and so on. The first switching module terminal 11-1 of the first switching module 10-1 is, as shown in FIG. 5, connected to a DC voltage source 2 via a source-side inductance 3. The DC voltage source 2 may be, for example, an energy generation unit, for example a photovoltaic installation, a storage system, a battery charger, a wind power installation, a rectifier or the like. The second switching module terminal 12-n of the last switching module 10-n is, as shown in FIG. 5, connected to a load 4 via a load-side inductance 6. The load 4 may be, for example, a drive of a DC voltage grid or the like.

FIG. 5 shows the electrical equivalent circuit diagram of a switching device 1, which consists of two series-connected switching modules 10-1 and 10-2, which are constructed in each case as described in FIG. 3. The switching device 1 is connected to the DC voltage source 2 via the abovementioned source-side inductance 3. A source-side capacitor 7 is connected in parallel with the series circuit comprising the DC voltage source 2 and the source-side inductance 3. On the output side, the switching device 1 is connected to the load 4 via the load-side inductance 5. A load-side capacitor 8 is connected in parallel with the load 4. The capacitors 7, 8 are, for example, DC-link capacitors of converters. In addition, a series circuit comprising a capacitive load 9 and a switch 9S is optionally provided in FIG. 5, wherein the series circuit is arranged in parallel with the load-side capacitor 8. The source-side and load-side inductances 3, 5 do not necessarily need to represent physical components of the DC voltage grid. The source-side and load-side inductances 3, 5 may also be line inductances.

The mode of operation of the switching device shown in FIG. 5 for connecting the DC grid having the capacitor 7 to the DC grid having the capacitor 8 is as follows: it is assumed that the capacitor 7 of the DC voltage grid on the left-hand side in FIG. 5 is charged, whereas the capacitor 8 of the DC voltage grid on the right-hand side in FIG. 5 is discharged. The controllable semiconductor switching elements 13-1, 13-2 of the two switching modules 10-1, 10-2 are off. In order to avoid high compensation currents between the capacitors 7, 8 given simultaneous switching-on of the controllable semiconductor switching elements 13-1, 13-2, first only the controllable semiconductor switching element of one of the modules 10-1, 10-2 is switched on. For example, the controllable semiconductor switching element 13-1 of the switching module 10-1 is switched on, while the controllable semiconductor switching element 13-2 of the switching module 10-2 remains switched off. As a result, the capacitor 15-1 of the switching module 10-1, which, in the same way as the capacitor 15-2 of the switching module 10-2, was charged to half the bus voltage, is discharged via the resistor 14-1 of the switching module 10-1. At the same time, the capacitor 15-2 of the switching module 10-2 is charged to the full bus voltage via the series-connected resistor 14-2 of said switching module. The bus voltage is in this case the voltage prevailing in the left-hand DC voltage grid. The resistor 14-2 therefore acts as a current-limiting resistor between the two capacitors 15-1, 15-2.

Then, the controllable semiconductor switching element 13-1 of the switching module 10-1 is switched off, while at the same time or shortly thereafter the controllable semiconductor switching element 13-2 of the switching module 10-2 is switched on. As a result, the capacitor 15-2 of the switching module 10-2 is discharged via the resistor 14-2. At the same time, the capacitor 15-1 is charged via the resistor 14-1, with the result that the resistor 14-1 of the switching module 10-1 now acts as a current-limiting resistor between the capacitors 7, 8. In the meantime, the two semiconductor switching elements can temporarily also be switched off again.

This procedure is now repeated until the voltages of the source-side and load-side capacitances 7, 8 have aligned with one another.

The average current which flows between the two DC voltage grids can be set by the switching frequency (i.e. the change between a state in which the controllable semiconductor switching element 13-1 of the switching module 10-1 is on and the controllable semiconductor switching element 13-2 of the switching module 10-2 is off and another state in which the switching states are reversed) and by the temporary turning-off of both semiconductor switching elements. In addition, by virtue of a variation in the pulse width ratio and therefore only partial discharge of the capacitors 15-1 and 15-2 of the switching modules 10-1, 10-2, the current can also be set in a targeted manner. Regardless of this current setting by different switching sequences, the peak current is at least limited to the value which is determined by the voltage difference between the two buses and one of the two resistors 14-1 and 14-2.

If the circuit, as shown in FIG. 5, additionally has the capacitive load 9, which is switchable by means of the controllable switch 9S, a short circuit can be detected erroneously by the charging current caused in the switch 10. Such a short-circuit detection takes place generally by a monitoring circuit provided in the switching element 10. This can result in shutdown of the switch 10. This behavior can be avoided if the shutdown by the safety circuit of the switch 10 does not take place immediately, but first current limitation is achieved in the chopper mode. In this case, the method described in PCT/EP2018/054775 can be used. As a result, there remains time for detecting whether there is actually a short circuit in the load-side bus segment or whether there is only a temporarily increased charging current owing to the connection of the capacitive load 9. For this purpose, firstly the current characteristic in the switch 10 can be monitored directly. In some embodiments, the voltage characteristic in the load path 6 can be monitored. When the capacitive load 9 is connected, the voltage will dip only briefly, whereas in the event of a short circuit a permanent voltage drop would be the case.

The control of the controllable semiconductor switching elements 13-1, 13-2 and of the optionally provided switch 9S takes place with the aid of the abovementioned control unit (not illustrated in the drawings).

The described procedure can be performed in a corresponding manner irrespective of how large the number n of the series-connected switching modules. Which of the controllable semiconductor switching elements 13-i at a given point in time are off and which other controllable semiconductor switching elements 13-i are on can take place either with targeted control of the mentioned (but not shown) control unit. Likewise, by virtue of the suitable, different selection of respective upper switching thresholds, the behavior over time of the switching-on and switching-off of the associated controllable semiconductor switching element can be influenced.

In some embodiments, the voltage present across the respective capacitors 15-i can be monitored by corresponding measurement means (not shown). In this case, the controllable semiconductor switching element associated with the capacitor at which there is the highest voltage is switched on until the preset lower threshold value has been reached. Since different switching modules or capacitors thereof always have a highest voltage at different points in time, there is a more or less random switching-on and switching-off of the controllable semiconductor switching elements 13-i of the switching modules 10-i.

Figure 6:
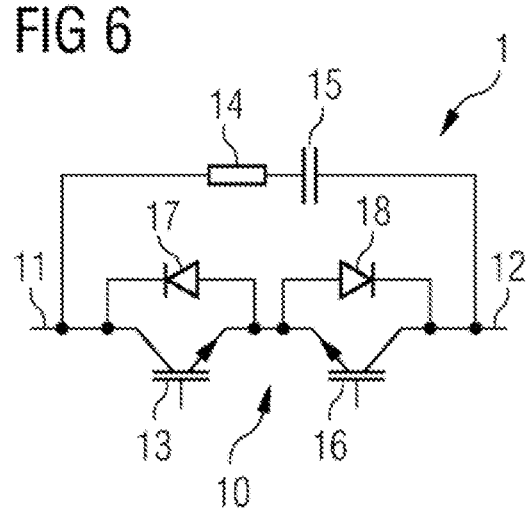
FIG. 6 shows an exemplary embodiment of a bidirectional switching module, which can be used instead of the switching modules in FIGS. 3 to 5.

FIG. 6 shows a development of the switching module 10 shown in FIG. 3. In addition to the semiconductor switching element 13, a further semiconductor switching element 16 is connected back-to-back in series with the controllable semiconductor switching element 13. The controllable semiconductor switching element 13 and the further controllable semiconductor switching element 16 may be of the same type, for example IGBTs. The behavior of this bidirectionally operable switching module 10 corresponds to the behavior of the switching module from FIG. 3. The current flow can be directed in both directions in the case of the bidirectional switching module 10 shown in FIG. 6. In this case, one of the two controllable semiconductor switching elements 13, 16 is on in the conducting case and the other is off. The current flow is ensured via a respective diode 17 or 18 connected back-to-back in parallel.

The described device can be used in a multiplicity of applications. For example, the current-regulated precharging of a capacitance with the aid of the switching device described here can be used in electrical aviation, in electrical switching devices of industrial installations and in drives, such as, for example ships and/or aircraft. In particular, DC voltage grids with a high power density can be coupled to one another in a simple manner. The device has a low level of complexity and only requires a low number of components, as a result of which the device can be supplied with a low weight.

LIST OF REFERENCE SYMBOLS

1 switching device
2 DC voltage source
3 source-side inductance
4 load
5 load-side inductance
6 line to be interrupted
7 source-side capacitance
8 load-side capacitance
9 capacitive load
9S switch
10 switching module
10-1, . . . , 10-n switching module
11 first switching module terminal
11-1, . . . , 11-n first switching module terminal
12 second switching module terminal
12-1, . . . , 12-n first switching module terminal
13 semiconductor switching element
13-1, . . . , 13-n semiconductor switching element
14 resistor
14-1, . . . , 14-n resistor
15 capacitor
15-1, . . . , 15-n capacitor
I current

What is claimed is:

1. A device for coupling two DC grids comprising source-side and load-side capacitances, the device comprising:
    a switching device for current regulation,
    the switching device including two series-connected switching modules;
    wherein each of the switching modules includes at least one controllable semiconductor switching element connected in parallel to a respective series circuit comprising a resistor and a capacitor;
    a control unit programmed to:
        switch the controllable semiconductor switching element of one of the two switching modules on and at the same time switch the controllable semiconductor switching element of the other of the two switching modules off;
        switch the controllable semiconductor switching element of the other of the two switching modules on and at the same time switch the controllable semiconductor switching element of the one of the two switching modules off;
        repeat steps a) and b) until the voltages of the source-side and load-side capacitances have aligned with one another; and
        switch the controllable semiconductor switching elements of the two switching modules on.

2. The device as claimed in claim 1, wherein the control unit is programmed to perform steps a) and b) temporally one after the other.

3. The device as claimed in claim 1, wherein the control unit is designed to set, based on the durations of the performance of steps a) and/or b), the average current from the one DC grid into the other DC grid.

4. The device as claimed in claim 1, wherein the control unit is programmed to set, based on a pulse width ratio of the controllable semiconductor switching modules switched on in steps a) and/or b), the current from the one DC grid into the other DC grid.

5. The device as claimed in claim 1, wherein:
at least one of the two DC grids comprises a capacitive load switchable using a controllable switch; and,
the control unit is programmed to operate the switching device for current regulation in the chopper mode when the control unit receives a signal from the controllable switch which signals a short circuit.

6. The device as claimed in claim 5, wherein the control unit is programmed to evaluate the current characteristic which flows from the other of the two DC grids to the one of the two DC grids with the switchable capacitive load.

7. The device as claimed in claim 5, wherein the control unit is programmed to evaluate the voltage characteristic during the chopper mode of the switching device.

8. A method for coupling two DC grids comprising source-side and load-side capacitances using a switching device for current regulation, wherein the switching device comprises two series-connected switching modules, wherein each of the switching modules comprises at least one controllable semiconductor switching element, with which a series circuit comprising a resistor and a capacitor is connected in parallel, wherein, a control unit of the switching device is programmed to:
(a) switch on the controllable semiconductor switching element of one of the two switching modules and at the same time switching off the controllable semiconductor switching element of the other of the two switching modules;
(b) switch on the controllable semiconductor switching element of the other of the two switching modules is switched on and at the same time switch off the controllable semiconductor switching element of the one of the two switching modules;
repeat (a) and (b) until the voltages of the source-side and load-side capacitances are aligned with one another; and
switch on the controllable semiconductor switching elements of both of the two switching modules.

9. The method as claimed in claim 8, wherein the control unit performs steps a) and b) temporally one after the other.

10. The method as claimed in claim 8, wherein the control unit is programmed to match respective edurations of the performance of steps a) and/or b) to set the average current from the one DC grid into the other DC grid to a specific value.

11. The method as claimed in claim 8, wherein the control unit is programmed to match a pulse width ratio of the controllable semiconductor switching modules which are switched on in steps a) and/or b) in order to set the current from the one DC grid into the other DC grid.

12. The method as claimed in claim 8, wherein:
at least one of the two DC grids comprises a capacitive load which is switchable by means of a controllable switch; and
the switching device for current regulation is operated in the chopper mode when the control unit receives a signal from the controllable switch which signals a short circuit.

13. The method as claimed in claim 12, wherein the control unit is programmed to evaluate the current characteristic which flows from the other of the two DC grids to the one of the two DC grids with the switchable capacitive load.

14. The method as claimed in claim 12, wherein the control unit is programmed to evaluate the voltage characteristic during the chopper mode of the switching device.

15. A computer program product stored on a non-transitory medium and when executed by an arithmetic logic unit, causes the arithmetic logic unit to:
(a) switch on a controllable semiconductor switching element of one of two switching modules and at the same time switching off a controllable semiconductor switching element of the other of the two switching modules;
(b) switch on the controllable semiconductor switching element of the other of the two switching modules is switched on and at the same time switch off the controllable semiconductor switching element of the one of the two switching modules;
repeat (a) and (b) until the voltages of the source-side and load-side capacitances are aligned with one another; and
switch on the controllable semiconductor switching elements of both of the two switching modules.

* * * * *